United States Patent [19]
Juri et al.

[11] Patent Number: 5,329,475
[45] Date of Patent: Jul. 12, 1994

[54] DATA ROUND-OFF DEVICE FOR ROUNDING-OFF M-BIT DIGITAL DATA INTO (M-N) BIT DIGITAL DATA

[75] Inventors: Tatsuro Juri, Osaka; Shinya Kadono, Katano, both of Japan

[73] Assignee: Matsushita Electric Industrial Co., Ltd., Osaka, Japan

[21] Appl. No.: 979,668

[22] Filed: Nov. 20, 1992

Related U.S. Application Data

[63] Continuation of Ser. No. 736,056, Jul. 26, 1991, Pat. No. 5,218,563.

[30] Foreign Application Priority Data

Jul. 30, 1990 [JP] Japan .................................. 2-202123

[51] Int. Cl.$^5$ ............................................. G06F 7/38
[52] U.S. Cl. .................................................. 364/745
[58] Field of Search ........... 364/745, 748, 768, 715.01, 364/715.08

[56] References Cited

U.S. PATENT DOCUMENTS

| | | |
|---|---|---|
| 4,149,261 | 4/1979 | Harigaya et al. |
| 4,553,128 | 11/1985 | Pilost . |
| 4,589,084 | 5/1986 | Fling et al. ........................... 364/745 |

*Primary Examiner*—Tan V. Mai
*Attorney, Agent, or Firm*—Wenderoth, Lind & Ponack

[57] ABSTRACT

A data round-off device receives a digital input signal of m-bit form (m is an integer) which has arithmetically been processed by addition, subtraction, multiplication, and division by an orthogonal transformer or predictive encoder is summed, if it is positive, with a value of $2^{(n-1)}-1$ (n is a natural number smaller than m) and if negative, with a value of $2^{(n-1)}$ and the higher $(m-n)$ bits of a resultant sum signal are delivered as the output of the data round-off device. Preferably, it is used for control of the number of bits if there is a difference in the number of bits between the data output of an orthogonal transformer and the data input of an encoder for encoding the data output of the orthogonal transformer.

4 Claims, 4 Drawing Sheets

| LEAST 4 BITS | OUT-PUT | LEAST 4 BITS | OUT-PUT |
|---|---|---|---|
| 0 0 0 0 | 0 | 1 0 0 0 | 0 |
| 0 0 0 1 | 0 | 1 0 0 1 | 1 |
| 0 0 1 0 | 0 | 1 0 1 0 | 1 |
| 0 0 1 1 | 0 | 1 0 1 1 | 1 |
| 0 1 0 0 | 0 | 1 1 0 0 | 1 |
| 0 1 0 1 | 0 | 1 1 0 1 | 1 |
| 0 1 1 0 | 0 | 1 1 1 0 | 1 |
| 0 1 1 1 | 0 | 1 1 1 1 | 1 |

FIG. 8-a

| MSB | LEAST 4 BITS | OUT-PUT | MSB | LEAST 4 BITS | OUT-PUT |
|---|---|---|---|---|---|
| 0 | 0 0 0 0 | 0 | 0 | 1 0 0 0 | 0 |
| 0 | 0 0 0 1 | 0 | 0 | 1 0 0 1 | 1 |
| 0 | 0 0 1 0 | 0 | 0 | 1 0 1 0 | 1 |
| 0 | 0 0 1 1 | 0 | 0 | 1 0 1 1 | 1 |
| 0 | 0 1 0 0 | 0 | 0 | 1 1 0 0 | 1 |
| 0 | 0 1 0 1 | 0 | 0 | 1 1 0 1 | 1 |
| 0 | 0 1 1 0 | 0 | 0 | 1 1 1 0 | 1 |
| 0 | 0 1 1 1 | 0 | 0 | 1 1 1 1 | 1 |

FIG. 8-b

| MSB | LEAST 4 BITS | OUT-PUT | MSB | LEAST 4 BITS | OUT-PUT |
|---|---|---|---|---|---|
| 1 | 0 0 0 0 | 0 | 1 | 1 0 0 0 | 1 |
| 1 | 0 0 0 1 | 0 | 1 | 1 0 0 1 | 1 |
| 1 | 0 0 1 0 | 0 | 1 | 1 0 1 0 | 1 |
| 1 | 0 0 1 1 | 0 | 1 | 1 0 1 1 | 1 |
| 1 | 0 1 0 0 | 0 | 1 | 1 1 0 0 | 1 |
| 1 | 0 1 0 1 | 0 | 1 | 1 1 0 1 | 1 |
| 1 | 0 1 1 0 | 0 | 1 | 1 1 1 0 | 1 |
| 1 | 0 1 1 1 | 0 | 1 | 1 1 1 1 | 1 |

DATA ROUND-OFF DEVICE FOR ROUNDING-OFF M-BIT DIGITAL DATA INTO (M-N) BIT DIGITAL DATA

This is a continuation of application Ser. No. 07/736,056, filed Jul. 26, 1991, U.S. Pat. No. 5,218,563.

BACKGROUND OF THE INVENTION

1. Field of the Invention

The present invention relates to a data round-off device for use in reducing the number of effective data bits during high efficiency encoding of video or audio signals.

2. Description of the Prior Art

In general, the data of a video or audio signal is redundant and thus, can be trimmed by high efficiency coding for optimum transmission and recording. The high efficiency coding is commonly carried out using an orthogonal transformation method or a predictive coding technique. The former is performed by the data of an digital input signal being divided into blocks corresponding to groups of a given number of pixels and processed by orthogonal transformation in each block before orthogonally transformed data of each block being encoded. The latter is conducted in which the information of a pixel to be transmitted being estimated from its adjacent pixel data and a resultant estimated error is transmitted. In such high efficiency coding procedures, the orthogonally transformed data and the estimated error are quantized and a resultant quantized value is then encoded by a fixed or variable length encoding technique for transmission and recording.

It is known that the quantization of the orthogonally transformed data and the estimated error is executed by a linear quantizing process in which the data to be quantized is divided into a given number of quantizing steps and the value of each quantizing step is converted to an integer which is given as the quantized value. In such a linear quantizing process, the division produces a decimal fraction which is in turn rounded by a data round-off device into an integer. A conventional data round-off device is arranged to perform rounding up or down by replacing the digits after the decimal point with zeros. And more familiar, the rounding up is carried out by increasing the first place digit by one if the digit in the first decimal place is 5 or greater.

However, when so-called mid tread quantization which is effective in high-efficiency-coding is used during the rounding up or down operation, considerable error of skipping one step at maximum tends to occur and a resultant code signal will exhibit degradation in the data quality. It is common that if a fractional part of the decimal fraction is 0.5 or more, it is rounded up and if not, it is rounded down. When the fractional part is 0.5, both the rounding up and down processes produce the same magnitude of a quantizing error. Usually in encoding, the smaller the absolute value of a code, the more the data can be reduced. Hence, the rounding up is not preferred when the fractional part is 0.5.

SUMMARY OF THE INVENTION

It is an object of the present invention to provide a data round-off device in which while the quantizing error is attenuated, the efficiency in high efficiency encoding is increased as compared with that of a conventional data round-off device.

In a data round-off device according to the present invention a digital input signal of m-bit form (m is an integer) arithmetically processed by addition, subtraction, multiplication, and division is summed, if it is positive, with a value of $2^{(n-1)}-1$ (n is a natural number smaller than m) and if negative, with a value of $2^{(n-1)}$, and the higher (m−n) bits of a resultant sum signal are delivered as the output of the data round-off device.

The operation of the data round-off device of the present invention is explained as follows. A conventional data round-off device for rounding an m-bit input signal by examining the least (n−1) bits is arranged in which $2^{(n-1)}$ is added to the input signal and the higher (m−n) bits of a resultant sum signal are released as the output. Hence, if the input signal is negative, the data round-off device of the present invention performs the same rounding operation as of the conventional data round-off device. Also, if the input signal is not negative and its least n bits are not equal to $2^{(n-1)}$, the data round-off device of the present invention calculates in the same way as a conventional device. If the input signal is positive and its least n bits are equivalent to $2^{(n-1)}$, the conventional data round-off device adds a bit of 1 to the higher (m−n) bits in rounding while the data round-off device of the present invention never does. Accordingly, the rounding error between input signal and output signal is $2^{(n-1)}$ with the conventional data round-off device and $-2^{(n-1)}$ with the data round-off device of the present invention. Both the rounding errors are equal in the magnitude and the absolute value of an output of the data round-off device of the present invention becomes smaller than that of the conventional data round-off device.

If round-off data are encoded with a variable length code encoder, the smaller the absolute value of the round-off is, the shorter the variable code length is.

BRIEF DESCRIPTION OF THE DRAWINGS

FIGS. 8-a and 8-b are tables for explaining the logic operation of the fourth embodiment.

DESCRIPTION OF THE PREFERRED EMBODIMENTS

Figure 1:
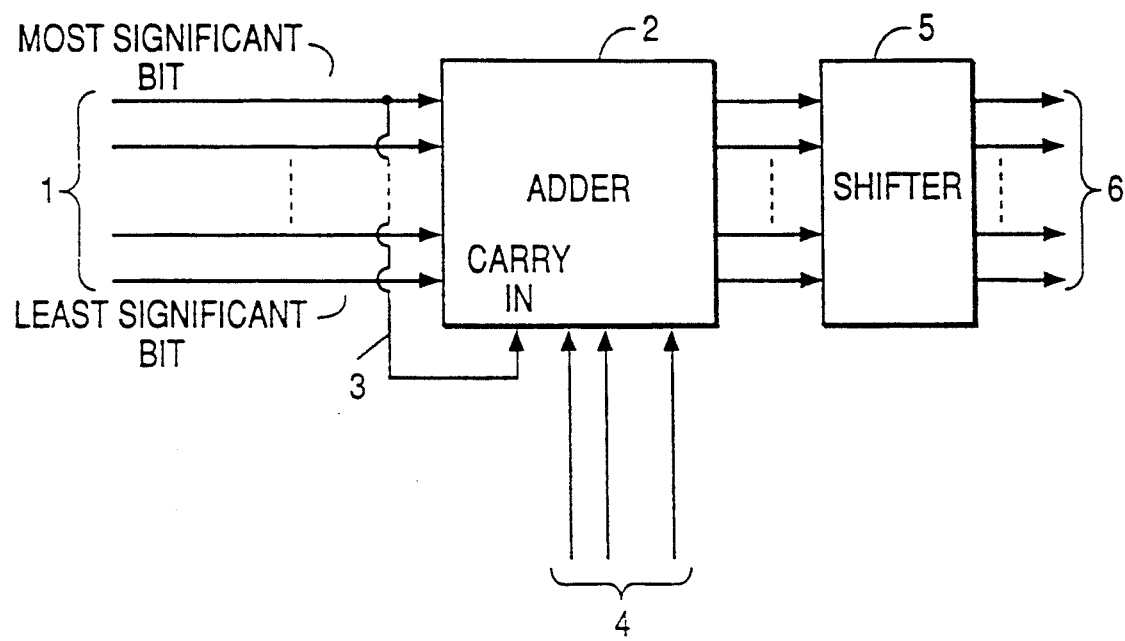
FIG. 1 a block diagram of a data round-off device in accordance with a first embodiment of the present invention.

FIG. 1 illustrates a data round-off device according to a first embodiment of the present invention, in which an m-bit input signal (m is a natural number) is rounded off to (m−n) bits (n is a natural number smaller than m) by deleting the least n bits. Shown in FIG. 1 are an input signal 1, an adder 2, an MSB (most significant bit) 3 of the input signal 1, an offset value 4, a shifter 5, and an output signal 6.

The input signal 1 of m-bit form is summed with the offset value 4 by the adder 2. The offset value is $2^{(n-1)} - 1$ expressed by an $(n-1)$ number of 1s in binary notation. Also, the MSB 3 of the input signal 1 is fed to the carry signal input of the adder 2. The adder 2 is commonly arranged for simultaneously adding a signal of one bit to the least significant bit in summation of two input signals. The one-bit signal is known as a carry signal. If the input signal 1 is negative, the most significant bit is 1 and thus, the carry signal is 1. Hence, the sum of the carry signal 3 and the offset value 4 is now equal to $2^{(n-1)}$. When the input signal 1 is negative, an output signal of the adder 2 is given as the sum of the input signal 1 and $2^{(n-1)}$. When the input signal is not negative, the carry signal is 0 and the output of the adder 2 becomes equal to the sum of the input signal 1 and $2^{(n-1)} - 1$. The shifter 5 retrieves the higher $(m-n)$ bits from the sum output of the adder 2 and delivers them as the output signal 6.

Through an operation of the foregoing arrangement, the least n bits of the value of an input signal are deleted if its absolute value is not more than $2^{(n-1)}$. If the absolute value is more than $2^{(n-1)}$, it is rounded up. In a common 0.5 round-up procedure, the value is rounded down when the least n bits of the value is less than $2^{(n-1)}$ and up when equal to or more than $2^{(n-1)}$. The rounding error of the data round-off device of the present invention becomes equal to that of the common rounding procedure, except when the least n bits are equal to $2^{(n-1)}$. When the least n bits represent $2^{(n-1)}$, the two rounding errors become different in the sign from each other but remain the same in the magnitude. As understood, the rounding error of the data round-off device of the present invention will never be greater than that of a conventional data round-off device.

For high efficiency encoding of output signals of the data round-off device, the sign of a rounding error is essential. The present invention produces such a rounding error that the absolute value of a signal becomes decreased when the least n bits are equivalent to $2^{(n-1)}$. In the common rounding procedure, the absolute value when positive is increased thus producing a rounding error. For example, when n is 1 and the input signal 1 also is 1, the common rounding procedure determines the absolute value to 1 while the data round-off device of the present invention produces the absolute value of 0. Also, when a signal is negative, its absolute value is decreased by the common rounding procedure. Hence, the resultant rounding errors are asymmetrical about zero. The data round-off device of the present invention produces rounding errors in symmetry about zero and accordingly, the input signal 1 and the output signal 6 will be identical to each other in the average value.

Figure 2:
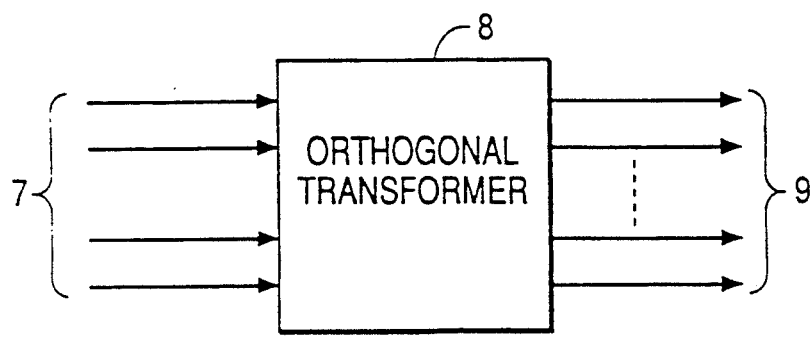
FIG. 2 is a block diagram of an orthogonal transformer coupled to the data round-off device.
Figure 3:
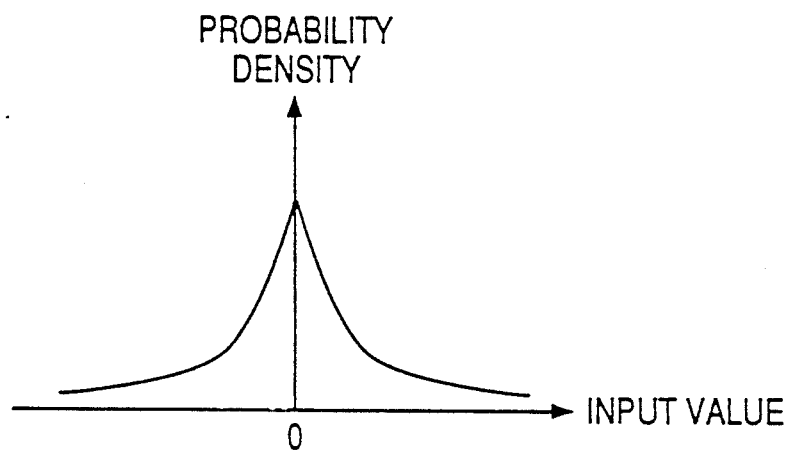
FIG. 3 is a graphic representation showing the relationship between the occurrence probability and absolute value of input signals of the first embodiment.

It wound be understood that the data round-off device of the present invention exhibits more advantage when the input signal is such that the smaller its absolute value, the higher the occurrence probability becomes. For example, a video signal which is processed by orthogonal transformation as shown in FIG. 2 exhibits such a specific probability distribution. Illustrated in FIG. 2 are an input signal 7, an orthogonal transformer 8, and an output signal 9. The input signal 7 which is a video signal is orthogonally transformed to the output signal 9 by the orthogonal transformer 8. The occurrence probability of the contents of the output signals 9 orthogonally transformed is expressed in such a distribution curve as shown in FIG. 3 which is almost symmetrical about zero. As is apparent, the occurrence probability is exponentially decreased as the absolute value of a signal becomes great. Accordingly, the output signal 9 can be rounded by the data round-off device of the present invention so that its absolute value is decreased without increasing a corresponding rounding error. More particularly, high occurrence probability signals or low absolute-value signals can be encoded with high efficiency and minimum loss by variable length code encoding to short length codes. Decreasing of the absolute value of a signal other than orthogonally transformed direct current components of the same is similar to low-pass filter processing thus contributing to the reproduction of an image with no quality declination. Although the first embodiment is described with the use of an orthogonally transformed input signal, the data round-off device of the present invention will be eligible in processing any input signal which exhibits a high occurrence probability distribution when its absolute value is small.

Figure 4:
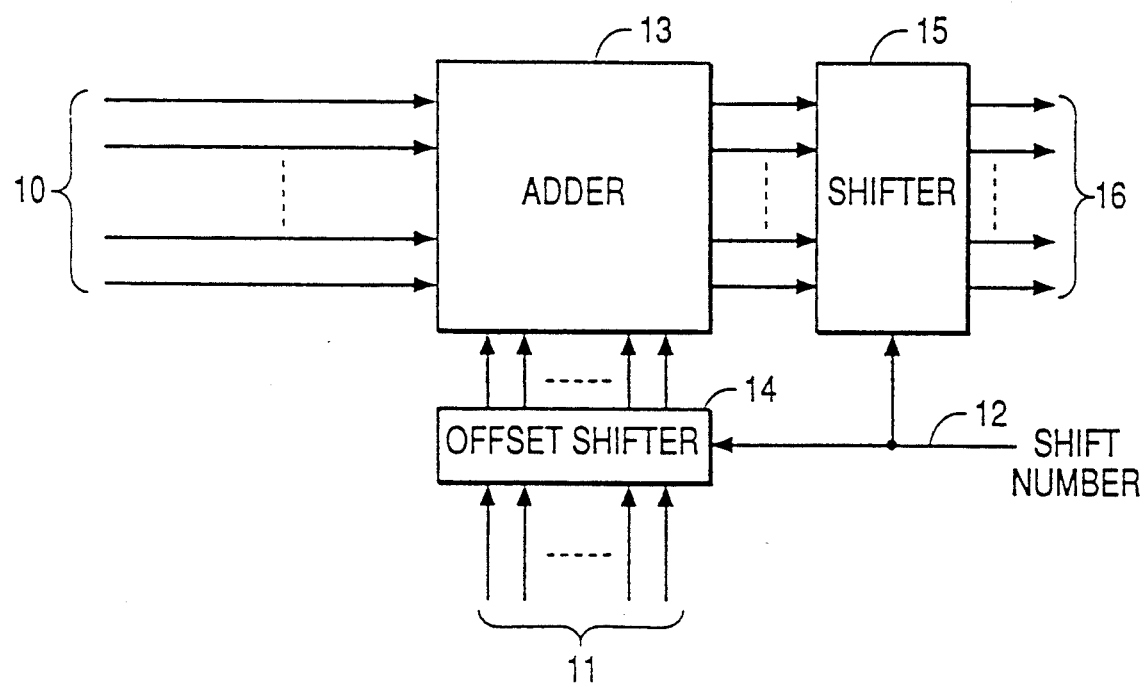
FIG. 4 is a block diagram of a data round-off device in accordance with a second embodiment of the present invention.

A second embodiment of the present invention will be described referring to FIG. 4. A data round-off device of the second embodiment is provided for an m-bit input signal (m is a positive number) is rounded to $(m-n)$ bits (n is a natural number smaller than m) by deleting the least n bits which can be varied by an outside means. It is assumed for ease of explanation that the input signal is a non-negative absolute value. As shown in FIG. 4, there are denoted an input signal 10, an offset value 11, a shift number 12 fed from the outside, an adder 13, an offset shifter 14, a shifter 15, and an output signal 16.

The offset value 11 is $2^{(k-1)} - 1$ (where k is a natural number smaller than m but greater than n) expressed by a $(k-1)$ number of 1s in binary notation. The offset value 11 can be shifted by the shift number 12 with the offset shifter 14. For example, if the shift number 12 is n, the offset value 11 is shifted $(k-n)$ bits by the offset shifter 14 and thus, its least $(n-1)$ bits are expressed by 0s and the remaining higher places are expressed by 1s. The resultant bit-shifted offset signal is then supplied to the adder 13 where it is added to the input signal 10. A sum output of the adder 13 is fed to the shifter 15 where the least bits determined by the shift number 12 which is equal to n is deleted. As the result, the shifter 15 delivers the higher $(m-n)$ bits as the output signal 16.

According to the second embodiment, the input signal can be rounded by deleting an arbitrarily determined shift number 12 of bits. Hence, adaptive quantization such as high efficiency encoding with the data round-off device of the second embodiment will be feasible. The present invention is not limited to the arrangement shown in FIG. 4 and a variety of other arrangements will be possible. Also, the input signal to the data round-off device may be other than an absolute value.

Figures 5, 6:
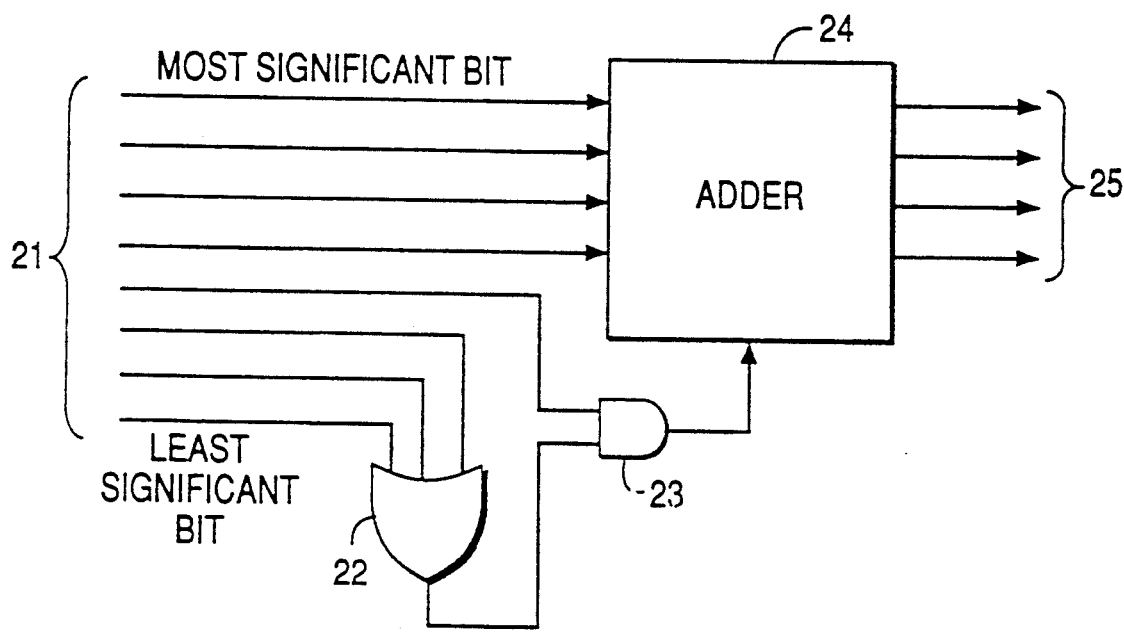
FIG. 5 is a block diagram of a data round-off device in accordance with a third embodiment of the present invention.
FIG. 6 is a table for explaining the logic operation of the third embodiment.

FIG. 5 illustrates a data round-off device in accordance with a third embodiment of the present invention, in which a non-negative 8-bit input signal is rounded to a 4-bit form by deleting the least significant four bits. Denoted in FIG. 5 are an input signal 21, an OR element 22, an AND element 23, an adder 24, and an output signal 25.

The third embodiment provides the data round-off device with no use of a shifter. A logic sum of the least 3 bits of the input signal 21 is calculated by the OR element 22 and transferred to the AND element 23 where it is combined with the fourth bit from the least of the input signal 21 for producing a logic product. The resultant outputs from logic operation with the OR and AND elements 22 and 23 are listed in FIG. 6. It is apparent that the output of the AND element 23 is 0 when the least 4 bits do not exceed $2^3$ and 1 when they exceed. Accordingly, when the output is added to the higher 4 bits of the input signal 21 at the adder 24, the output signal 25 becomes equal to that of the first embodiment where n is 4 and m is 8. The adder 24 is adapted for adding one bit to the input signal and thus, has a more simple hardware arrangement than the adder 2 of the first embodiment.

Figure 7:
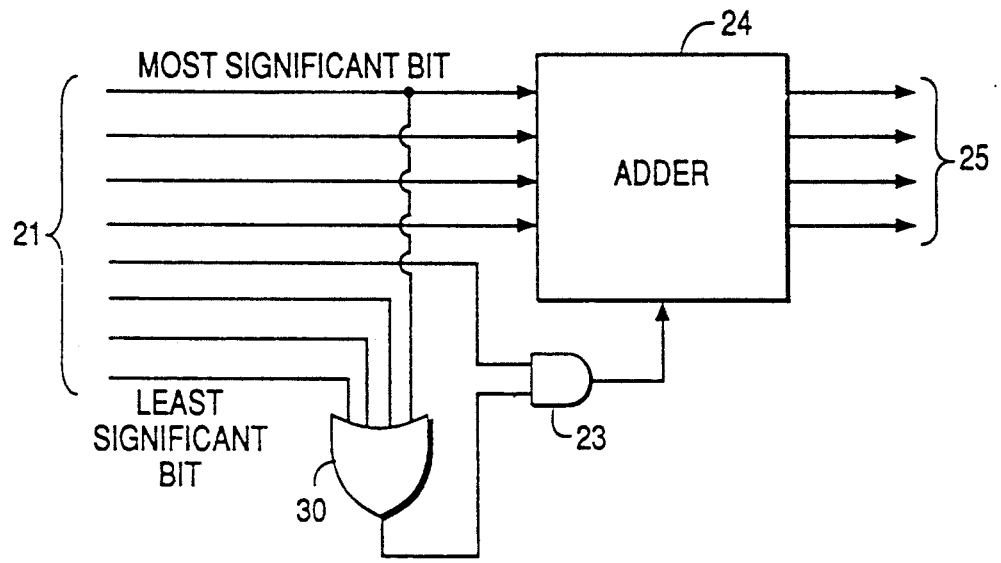
FIG. 7 is a block diagram of a data round-off device in accordance with a fourth embodiment of the present invention.

FIG. 7 is a block diagram in accordance with a fourth embodiment in which the input signal 21 is fed in the form of an 8-bit signal of two's complement. The arrangement of FIG. 7 is different from that of FIG. 5 in fact that the input to an OR element 30 is a sum of the input to the OR element 22 and the most significant bit (MSB) of the input signal 21. The resultant outputs from logic operation with the OR and AND elements 30 and 23 are listed in FIGS. 8-a and 8-b. FIG. 8-a shows a table of the outputs in which the input signal 21 is not negative while FIG. 8-b shows a like table in which the input signal 21 is negative. As apparent, the outputs in FIG. 8-a are identical to those in FIG. 6 and the outputs in FIG. 8-b are similar to those given by the common rounding procedure. It is now understood that the arrangement shown in FIG. 7 constitutes a modification of the data round-off device of the third embodiment in which both non-negative and negative forms of the input signal can be rounded off with equal success.

As described, the last two embodiments allow the least four bits of an input signal to be processed by a logic operation with the OR and AND elements 22(30) and 23, whereby their hardware arrangements are less elaborate than that of the first embodiment.

Although the input signal is rounded from an 8-bit form to a 4-bit form in the third and fourth embodiments, other combinations of bit inputs and rounded output are also possible.

What is claimed is:

1. A data round-off device for rounding an input m-bit digital signal which has a positive value to an (m−n) bit digital signal, where m is an integer and n is a natural number smaller than m, comprising:
a comparing means for comparing a value of a lower n-bit data of the input m-bit digital signal with a value of $2^{(n-1)}$ and for outputting a value '1' if the value of the lower n-bit data of the input m-bit digital signal is larger than the value of $2^{(n-1)}$ and a value '0' otherwise; and
an adding means for adding an output value of said comparing means to an upper (m−n)-bit data of the input m-bit digital signal thereby to obtain a rounded (m−n)-bit digital signal,
wherein said comparing means comprises:
a logical OR operation means for producing a logical sum of lower (n−1) bits of the input m-bit digital signal; and
a logical AND operation means for producing a logical product of said logical sum and an n-th bit from a least significant bit of the input m-bit digital signal, said logical product being outputted as the output value of said comparing means.

2. A data round-off device for rounding an input m-bit digital signal which has a positive value to an (m−n) bit digital signal, where m is an integer and n is a natural number smaller than m, comprising:
a comparing means for comparing a value of a lower n-bit data of the input m-bit digital signal with a value of $2^{(n-1)}$ and for outputting a value '1' if the value of the lower n-bit data of the input m-bit digital signal is larger than the value of $2^{(n-1)}$ and a value '0' otherwise; and
an adding means for adding an output value of said comparing means to an upper (m−n)-bit data of the input m-bit digital signal thereby to obtain a rounded (m−n)-bit digital signal,
wherein said comparing means comprises:
a logical OR circuit for receiving lower (n−1) bits of the input m-bit digital signal and for producing a logical sum of the lower (n−1) bits of the input m-bit digital signal; and
a logical AND circuit for receiving said logical sum from said logical OR circuit and an n-th bit from a least significant bit of the input m-bit digital signal and for producing a logical product of said logical sum and the n-th bit from the least significant bit of the input m-bit digital signal, said logical product being outputted as the output value of said comparing means.

3. A data round-off device according to claim 1, wherein the input m-bit digital signal is a digital signal having a small absolute value at a high probability.

4. A data round-off device according to claim 1, wherein the input m-bit digital signal is a digital signal which has been subjected to an orthogonal transformation.

* * * * *